(12) United States Patent
Shi et al.

(10) Patent No.: US 7,196,592 B2
(45) Date of Patent: Mar. 27, 2007

(54) VCO CIRCUIT WITH BROAD TUNING RANGE AND AMPLITUDE CONTROL

(75) Inventors: Bingxue Shi, Beijing (CN); Jiwei Chen, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 86 days.

(21) Appl. No.: 10/959,117

(22) Filed: Oct. 7, 2004

(65) Prior Publication Data

US 2006/0077012 A1 Apr. 13, 2006

(51) Int. Cl.
*H03B 5/00* (2006.01)
(52) U.S. Cl. .......................... 331/117 FE; 331/117 R; 331/167; 331/74; 331/177 V
(58) Field of Classification Search ............ 331/177 V, 331/117 R, 117 FE, 167, 74
See application file for complete search history.

(56) References Cited

U.S. PATENT DOCUMENTS

| 6,680,655 B2 * | 1/2004 | Rogers ....................... 331/109 |
| 6,909,336 B1 * | 6/2005 | Rajagopalan et al. ....... 331/183 |
| 7,116,183 B2 * | 10/2006 | Wu ............................ 331/176 |

* cited by examiner

*Primary Examiner*—Arnold Kinkead
(74) *Attorney, Agent, or Firm*—Birch, Stewart, Kolasch & Birch, LLP

(57) ABSTRACT

A voltage-controlled oscillator circuit. A pair of inductors are coupled to a first power source. A pair of capacitors respectively coupled between a variable resistor and the pair of inductors in serial. A pair of first switches respectively coupled between the pair of capacitors and a second power source. The first switch of the pair has a first control gate coupled to a connection point of the other first switch and the corresponding capacitor.

16 Claims, 7 Drawing Sheets

VCO CIRCUIT WITH BROAD TUNING RANGE AND AMPLITUDE CONTROL

BACKGROUND

The present disclosure relates in general to a voltage-controlled oscillator (VCO) circuit. In particular, the present disclosure relates to a VCO circuit with broad tuning range and amplitude control.

A voltage-controlled oscillator is an oscillator that generates an output signal with a frequency that varies in response to an input control voltage. VCOs can be found in many circuit applications. For example, a VCO is the central block in phase-locked loops (PLLs) and as such is one of the most important blocks in data communication circuitry. Many circuit applications demand a wide output frequency range with stable amplitude for the VCO.

A VCO generates an AC output signal whose frequency changes in response to a control voltage signal applied at an input terminal.

The output frequency is inversely related to the period between alternating cycles of the output signal. A variable timing element is generally used to change the period between alternating cycles and thus change the output frequency. Typically, the variable element is either a variable capacitance diode (varactor) or a variable resistance device. Known devices in either category have intrinsic limitations with respect to thermal stability, linearity, adaptability to integrated circuit techniques, etc., that complicate the design of VCO circuitry.

A conventional LC-based VCO can be modeled with a RLC parallel network, in which a variable capacitor is used for frequency tuning. Due to the absence of a good varactor compatible with CMOS process, however, the tuning range of integrated CMOS LC-based VCOs is typically lower than 20% of the center frequency.

Since the lot-to-lot process variations in on-chip capacitance and inductance may be as large as 20%, the oscillation frequency may also have an error of 20% or more for lot-to-lot difference. The tuning range of a VCO must be wide enough to compensate for the fluctuation. In addition, amplitude variation is detrimental to circuit operation. A constant amplitude control loop is also incorporated in this circuit, ensuring stable oscillation amplitude over the whole tuning range.

SUMMARY

Methods and devices for obtaining sampling clocks are provided. An embodiment of a voltage-controlled oscillator circuit, comprises: a pair of inductors coupled to a first power source; a variable resistor; a pair of capacitors respectively coupled between the variable resistor and the pair of inductors in serial; a pair of first switches respectively coupled between the pair of capacitors and a second power source, wherein the first switch of the pair comprises a first control gate coupled to a connection point of the other first switch and the corresponding capacitor. An amplitude control circuit, comprises: a peak detector having a first input terminal coupled to a connection point of the capacitor and the corresponding inductor, and a first output terminal, wherein a voltage level of the first output terminal tracks that of the first input terminal; an operational transconductance amplifier having a first input terminal coupled to the first output terminal, a input terminal for receiving a reference voltage, and a second output terminal for outputting an output signal according to the voltage level of the first output terminal and the reference voltage; a second switch coupled between the first control gates of the first switches, having a second control gate coupled to the second output terminal, wherein a turn-on status of the second switch corresponds to the output signal output by the operational transconductance amplifier.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only and thus are not limitative of the present invention.

DETAILED DESCRIPTION

Figure 1B:
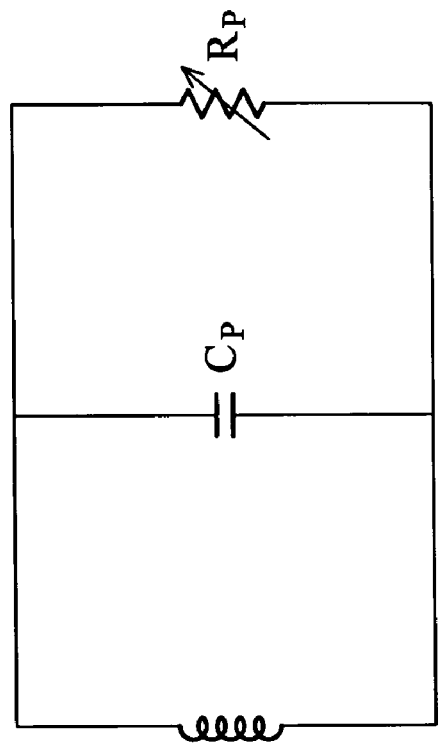
FIG. 1B shows the circuit transformed from FIG. 1A to a parallel form.
Figure 1A:
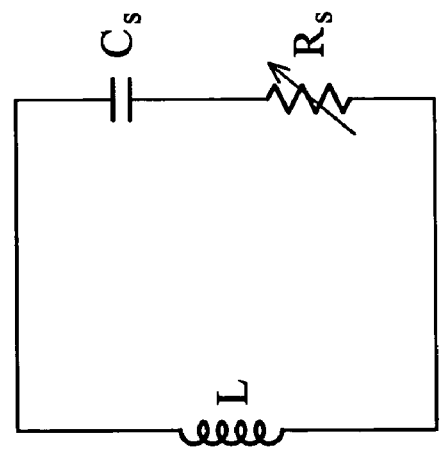
FIG. 1A shows a circuit of an inductor with a capacitor $C_S$ and a resistor $R_S$ connected in serial.

FIG. 1A shows a circuit of an inductor with a capacitor $C_S$ and a resistor $R_S$ connected in serials. FIG. 1B shows the circuit transformed from FIG. 1A to a parallel form.

Equating the real parts and imaginary parts of the impedances of the series and parallel RC sections respectively, the following transformation formulas can be achieved:

$$C_P = \frac{C_S}{1 + \omega^2 C_S^2 R_S^2} \quad (1)$$

$$R_P = R_S + \frac{1}{\omega^2 C_S^2 R_S} \quad (2)$$

It can be seen from equation (1) that $C_P$ is variable if $R_S$ is a tunable resistor controlled by a voltage.

The oscillation frequency of the circuit shown in FIG. 1A is given by:

$$f_O = \frac{1}{2\pi\sqrt{LC_P}} \quad (3)$$

By tuning the resistance of $R_S$, the equivalent parallel capacitance $C_P$ is changed, and the oscillation frequency is also changed.

The tunable resistor $R_S$ can be realized through a MOSFET with its gate connected to a control voltage, which can be easily implemented with CMOS technology. The capacitor $C_S$ can be realized with a metal-insulator-metal (MIM) capacitor, which is also a standard process in a mixed-signal CMOS process. Thus, the circuit eliminates varactor requirements.

It can be seen from equation (1) that when $R_S$ approaches zero, $C_P$ will be close to $C_S$, and when $R_S$ approaches infinite, $C_P$ will be close to zero. Theoretically, the frequency tuning range can be:

$$(f_{min}, f_{max}) = \left[\frac{1}{2\pi\sqrt{LC_P}}, \infty\right] \quad (4)$$

In an on-chip MIM capacitor, there is a parasitic capacitor between its lower plate and the substrate. The value of this parasitic capacitor can be one tenth or more of the normal value of the MIM capacitor generally, and determines a rough upper limit of the frequency range. If the parasitic capacitor is nominated as $C_{OX}$, the frequency tuning rangy can be revised as:

$$(f_{min}, f_{max}) = \left[\frac{1}{2\pi\sqrt{LC_P}}, \frac{1}{2\pi\sqrt{LC_{OX}}}\right] \quad (5)$$

In the previous equation, the ratio of the upper limit to the lower limit is about three.

In practice, the turn-on resistor of a MOSFET cannot be zero, and the parasitic capacitance of an on-chip MOSFET-type resistor, a MIM capacitor and other devices connected to this point will set an upper limit to the oscillation frequency much lower than the theoretical value.

Figure 2:
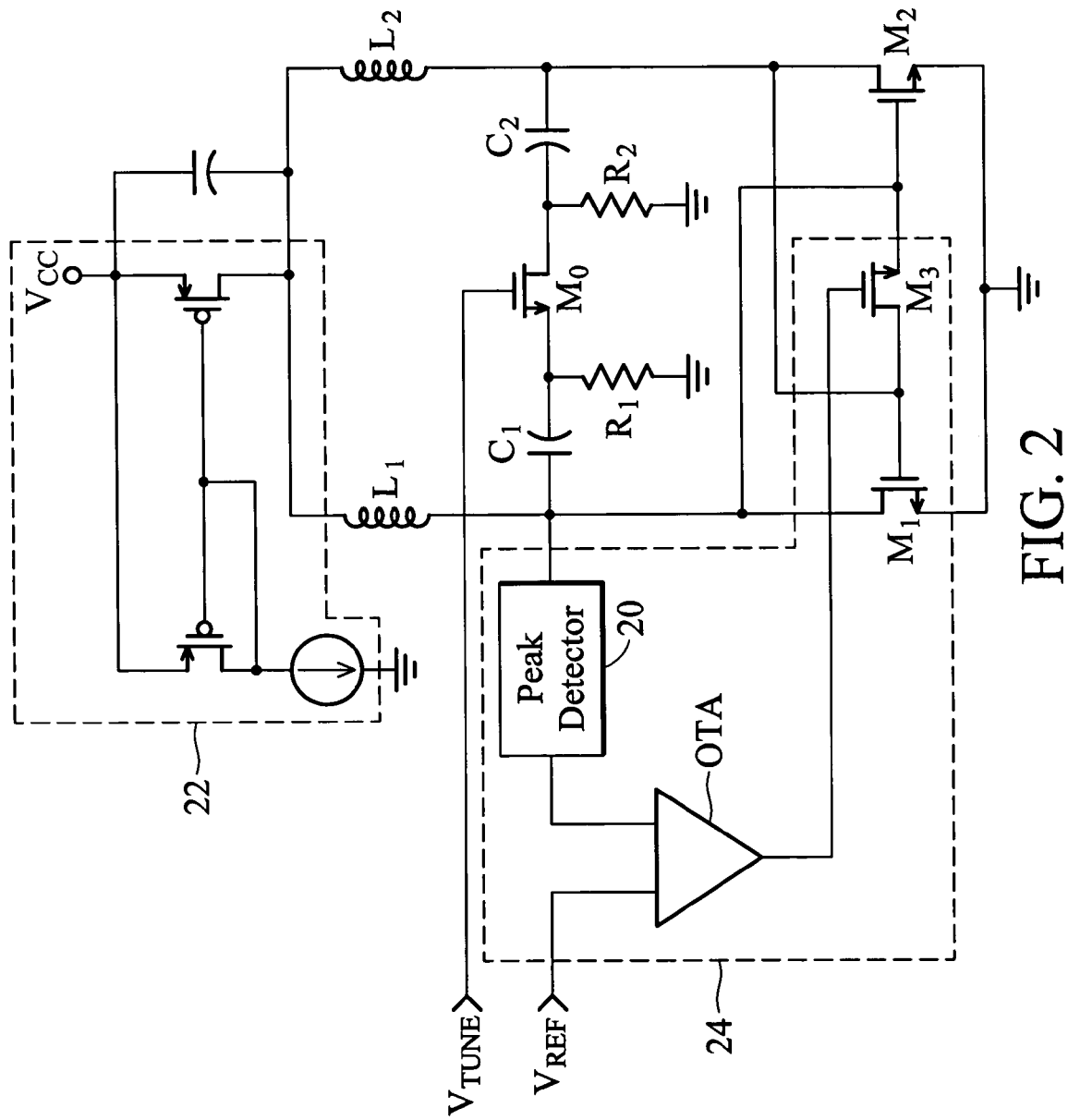
FIG. 2 shows a differential VCO circuit.

FIG. 2 shows a differential VCO circuit. A pair of inductors L1 and L2 are coupled to a current source generated by current mirror 22. A variable resistor comprises MOSFET MO, resistors R1 and R2 connected in serials. A pair of capacitors C1 and C2 respectively connected to MOSFET $M_o$ and the inductors L1 and L2. The source of NMOS transistor $M_1$ is connected to ground, the drain of the NMOS transistor $M_1$ is connected to the connection point of inductor L1, capacitor C1 and the gate of NMOS transistor $M_2$, and the gate of NMOS transistor $M_1$ is connected to the drain of NMOS transistor $M_2$. The source of NMOS transistor $M_2$ is connected to ground, the drain of the NMOS transistor $M_2$ is connected to the connection point of inductor L2, capacitor C2 and the gate of NMOS transistor $M_1$, and the gate of NMOS transistor $M_2$ is connected to the drain of NMOS transistor $M_1$.

Amplitude control circuit 24 comprises peak detector 20, operational transconductance amplifier OTA, and NMOS transistor $M_3$. Peak detector 20 has an input terminal coupled to a connection point of capacitor C1 and inductor L1, and an output terminal. Operational transconductance amplifier OTA has a first input terminal coupled to the output terminal of Peak detector 20, a second input terminal for receiving a reference voltage $V_{REF}$, and an output terminal for outputting an output signal according to the voltage level of the first input terminal and the reference voltage $V_{REF}$. NMOS transistor $M_3$ is connected between the gates of NMOS transistors $M_1$ and $M_2$. The gate of NMOS transistor $M_3$ is connected to output terminal of operational transconductance amplifier OTA.

The on-chip spiral inductor L and MIM capacitor C forms a resonant tank, and MOSFET $M_O$ is controlled by the tuning voltage $V_{TUNE}$ acting as the variable resistor. The cross-coupled differential pair formed by NMOS transistors $M_1$ and $M_2$ maintains the oscillation.

The frequency sensitivity is an important parameter of VCO, determined by the characteristic of MOSFET $M_O$. The turn-on resistance of MOSFET $M_O$ may change sharply when the tuning voltage $V_{TUNE}$ is near its threshold voltage, and a small variation of the control voltage may cause a large fluctuation in oscillation frequency. To alleviate this problem, several types of MOS transistors with different threshold voltages are connected in parallel. For example, the source and drain of each MOS transistor with different types are respectively connected to the capacitors C at both sides of MOSFET $M_O$, and their gates are all supplied by the tuning voltage $V_{TUNE}$.

As shown in equation (2), equivalent parallel resistor $R_P$ will decrease to a minimum value, then increase when MOSFET $M_O$ changes from cut-off to full turn-on. The minimum value of the equivalent parallel resistor $R_P$ is given by:

$$\min R_P = \frac{2}{\omega C_S} \quad (6)$$

At this time, the network is lossiest. So the bias point and size of NMOS transistors $M_1$ and $M_2$ must be determined to have a minimum acceptable transconductance for guaranteeing oscillation. This is expressed as:

$$\min g_m = \frac{1}{\min R_P} = \frac{\omega C_S}{2} \quad (7)$$

Since the equivalent parallel resistance $R_P$ may vary vastly over the entire tuning range, the oscillation amplitude can also be very different. Too large an oscillation amplitude may destroy the gate of NMOS transistors $M_1$ and $M_2$. This problem becomes more serious as the gate oxide becomes thinner with improvement of CMOS technology. In addition, too large oscillation amplitude also degrades the phase noise performance. Moreover, stable oscillation amplitude over the entire frequency tuning range is desirable for mixers.

An amplitude control circuit is shown in FIG. 2. The automatic amplitude control loop comprises peak detector 20, operational transconductance amplifier(OTA), and transistor $M_3$. A reference voltage $V_{REF}$ is provided to set the desired oscillation amplitude. When the signal amplitude at the input of peak detector 20 is too high, the peak value of the oscillation detected by peak detector 20 exceeds reference voltage $V_{REF}$, and a portion of the current is injected into the gate of transistor $M_3$, causing it to turn-on slightly, thus the resonant network becomes lossier to reduce the oscillation amplitude. When the peak at the input of peak detector 20 is equal to reference voltage $V_{REF}$, the push current and pull current are equal, keeping the gate voltage of transistor $M_3$ stable.

Figure 3:
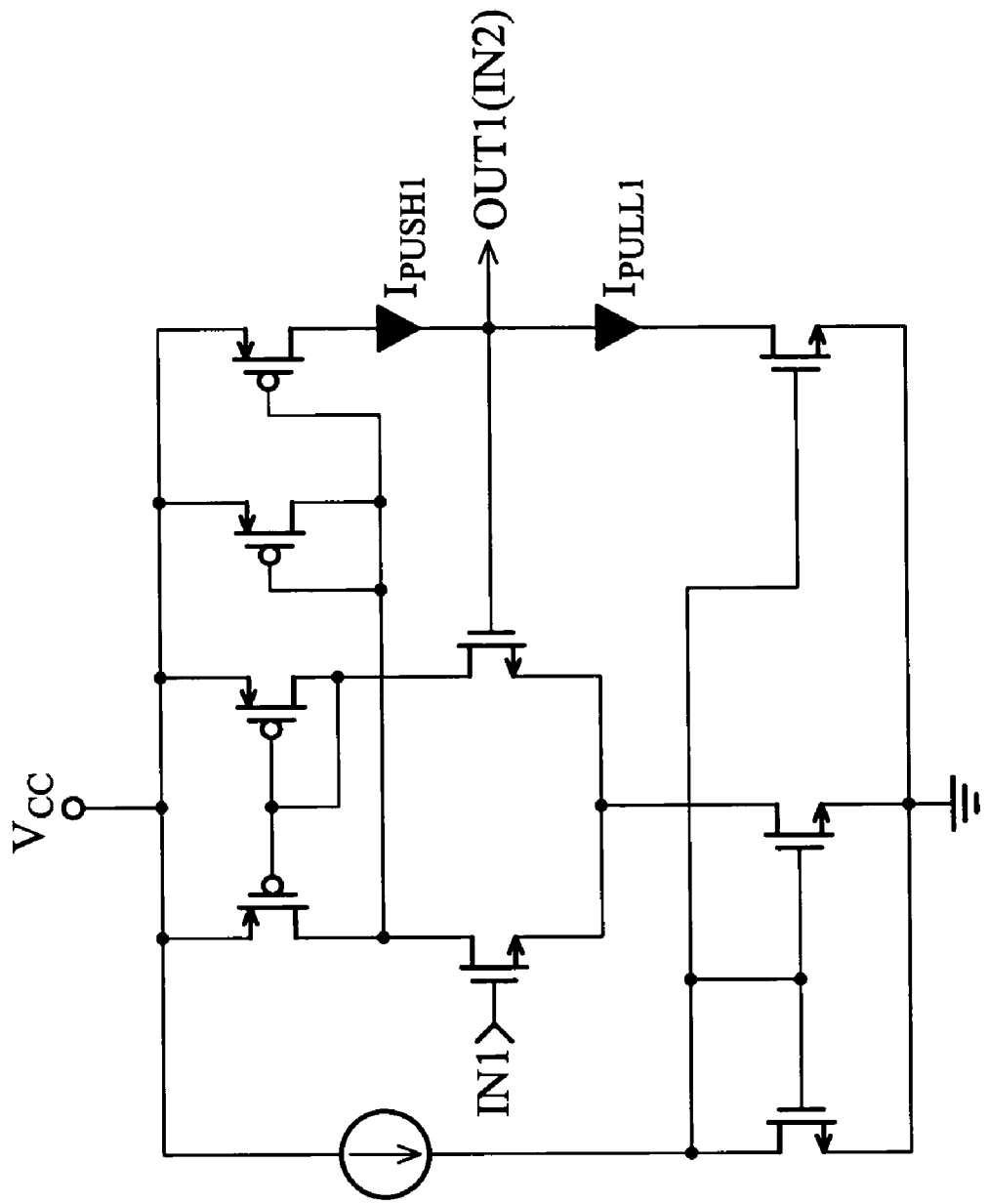
FIG. 3 is a detailed schematic of a circuit of peak detector 20.

FIG. 3 is a detailed schematic of a circuit of peak detector 20. The output of peak detector 20 is controlled by push current $I_{PUSH1}$ and pull current $I_{PULL1}$. When the voltage level of input terminal IN1 exceeds that of output terminal OUT1, a large current is injected into the output terminal OUT1, making its voltage rise rapidly. When the voltage level of input terminal IN1 is lower than that of output terminal OUT1, a small current is drained from the output terminal OUT1, decreasing its voltage slowly. Thus, the voltage level of output terminal OUT1 tracks the peak value of the input oscillation at input terminal IN1. The values of push current $I_{PUSH1}$ and pull current $I_{PULL1}$ determine the attack time and decay time of the peak detector 20, as directed by applications.

Figure 4:
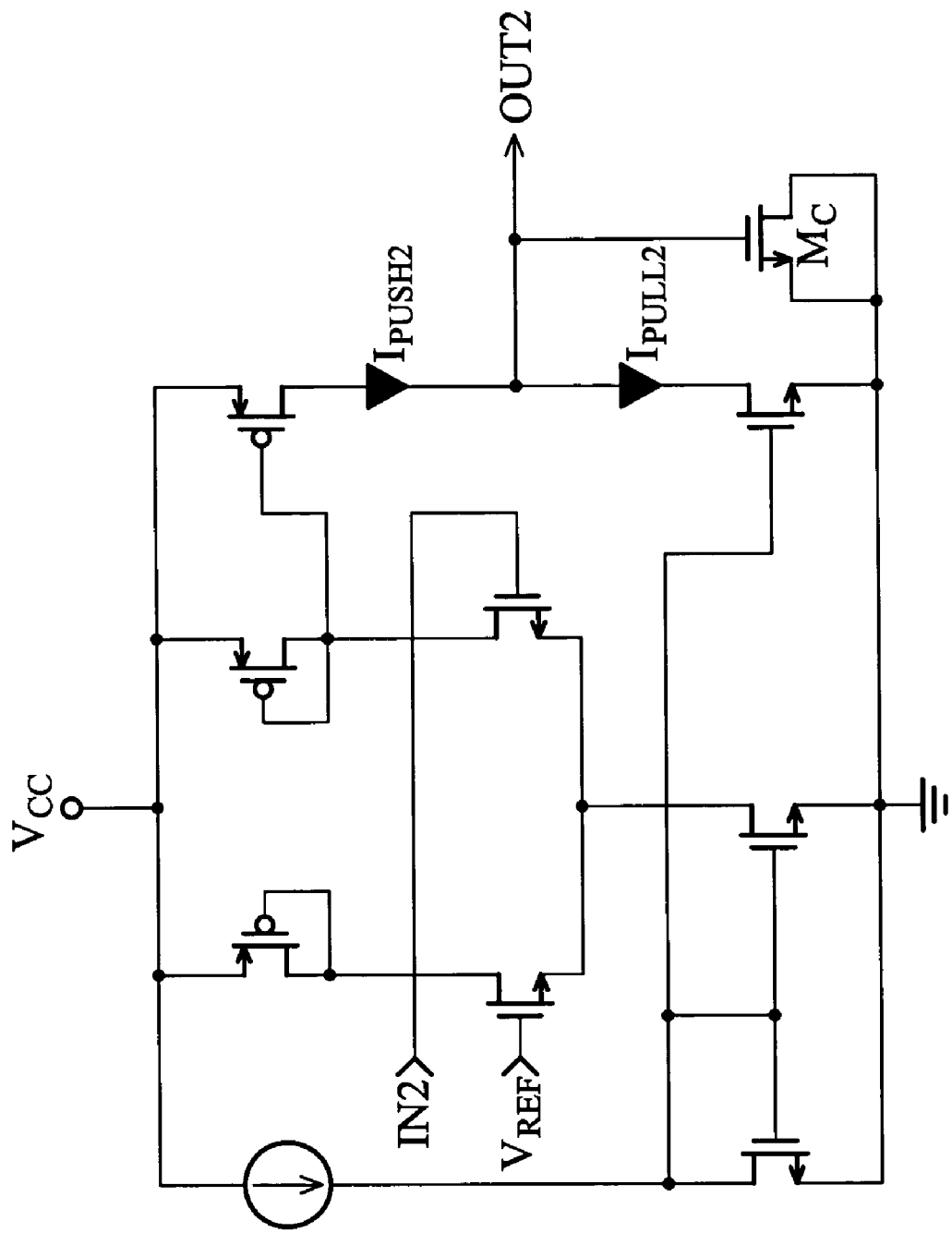
FIG. 4 is a detailed schematic of a circuit of OTA.

FIG. 4 is a detailed schematic of a circuit of OTA. Pull current $I_{PULL2}$ is a constant current, while push current $I_{PUSH2}$ is determined by the difference of the voltage level of input terminal IN2 and reference voltage $V_{REF}$. When the voltage level of input terminal IN2 equals reference voltage $V_{REF}$, then pull current $I_{PULL2}$ equals push current $I_{PUSH2}$, and the voltage level of the output terminal OUT2 is kept stable. NMOS transistor $M_C$ is connected as a capacitor with a gate coupled to the output terminal OUT2, and a drain and a source both connected to ground. The connections of NMOS transistor $M_C$ reduce the silicon area and achieve rapid charge time due to its low capacitance when the voltage level at output terminal OUT2 lower than the threshold voltage of NMOS transistor $M_C$, compared with conventional MIM capacitor.

According to the embodiments of the invention, the VCO circuit is designed and simulated in a 0.18 µm mixed-signal CMOS process with 1.8V supply voltage to the correctness of the circuit. All devices used including MOS transistors, MIM capacitors, on-chip spiral inductors, and resistors are real rather than simulated, with their parasitic provided by the foundry. No idealized components are included, such as the current sources shown in above circuits.

Figure 5:
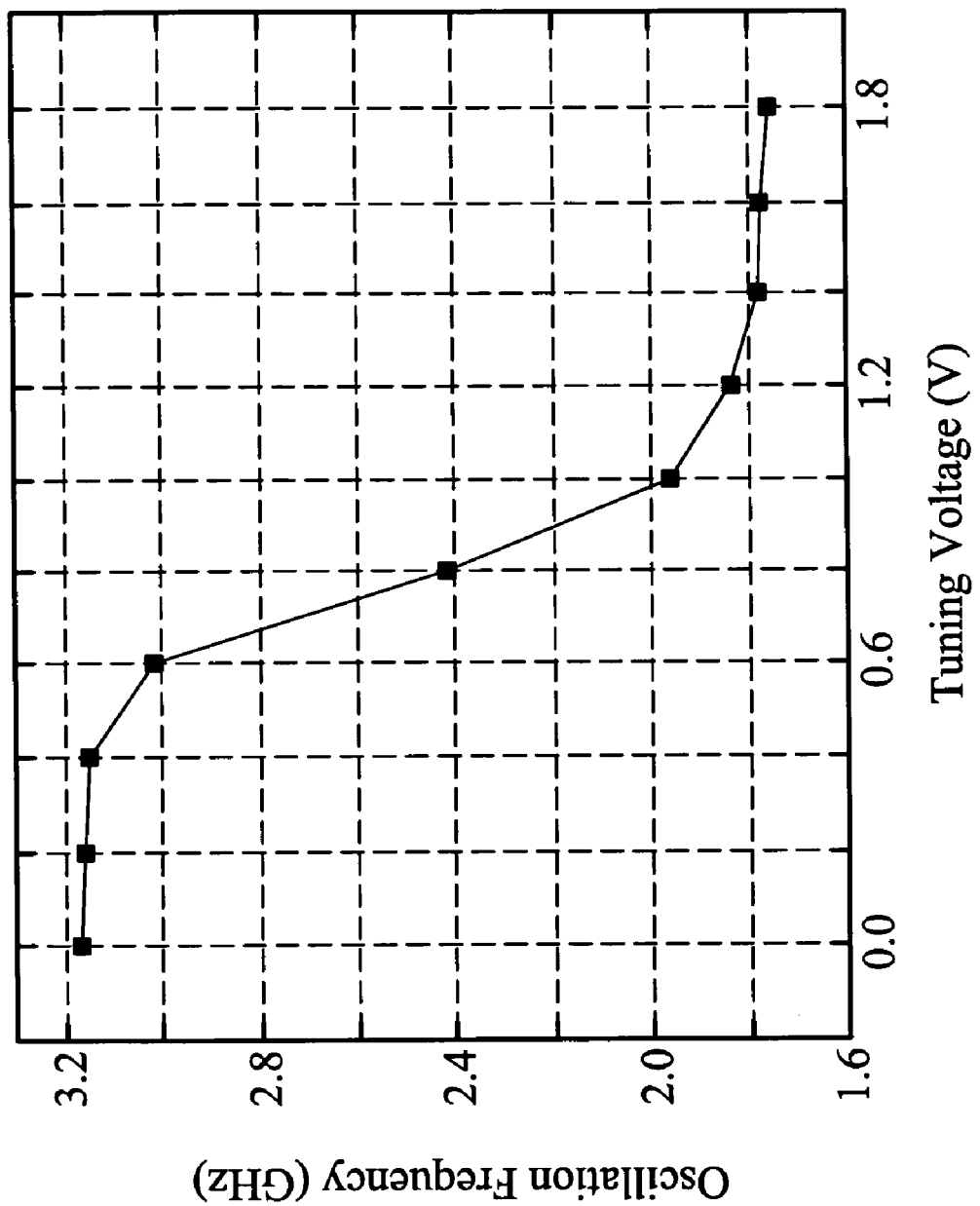
FIG. 5 shows the tuning characteristic of the VCO circuit according to an embodiment of the invention.

FIG. 5 shows the tuning characteristics of the VCO circuit according an embodiment of the invention. The minimum oscillation frequency is 1.75 GHz, while the maximum oscillation frequency is 3.16 GHz, achieving a tuning range of 57%, much wider than previously achieved.

Figure 6:
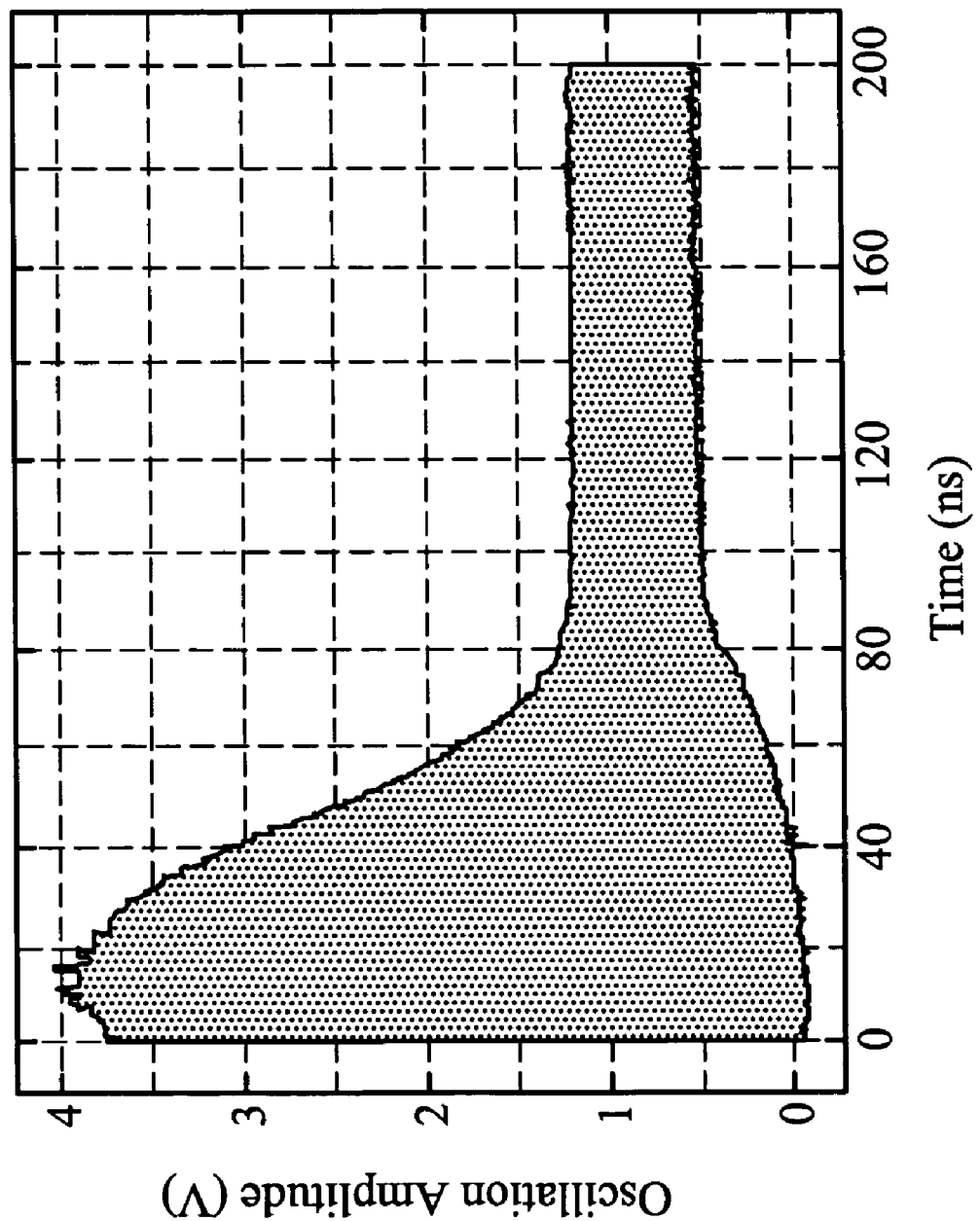
FIG. 6 shows the stabilization process of the oscillation amplitude when the tuning voltage is set to zero.

The amplitude regulation function is also valid. The reference voltage is set to stabilize the peak-to-peak-value of the oscillation amplitude at about 0.6V. FIG. 6 shows the stabilization process of the oscillation amplitude when the tuning voltage is set to zero. It can be seen that the initial amplitude approaches 4V, which is close to the break-down voltage of the gate oxide. After about 800 ns, the amplitude is stabilized and regulated to about 0.6V.

Figure 7:
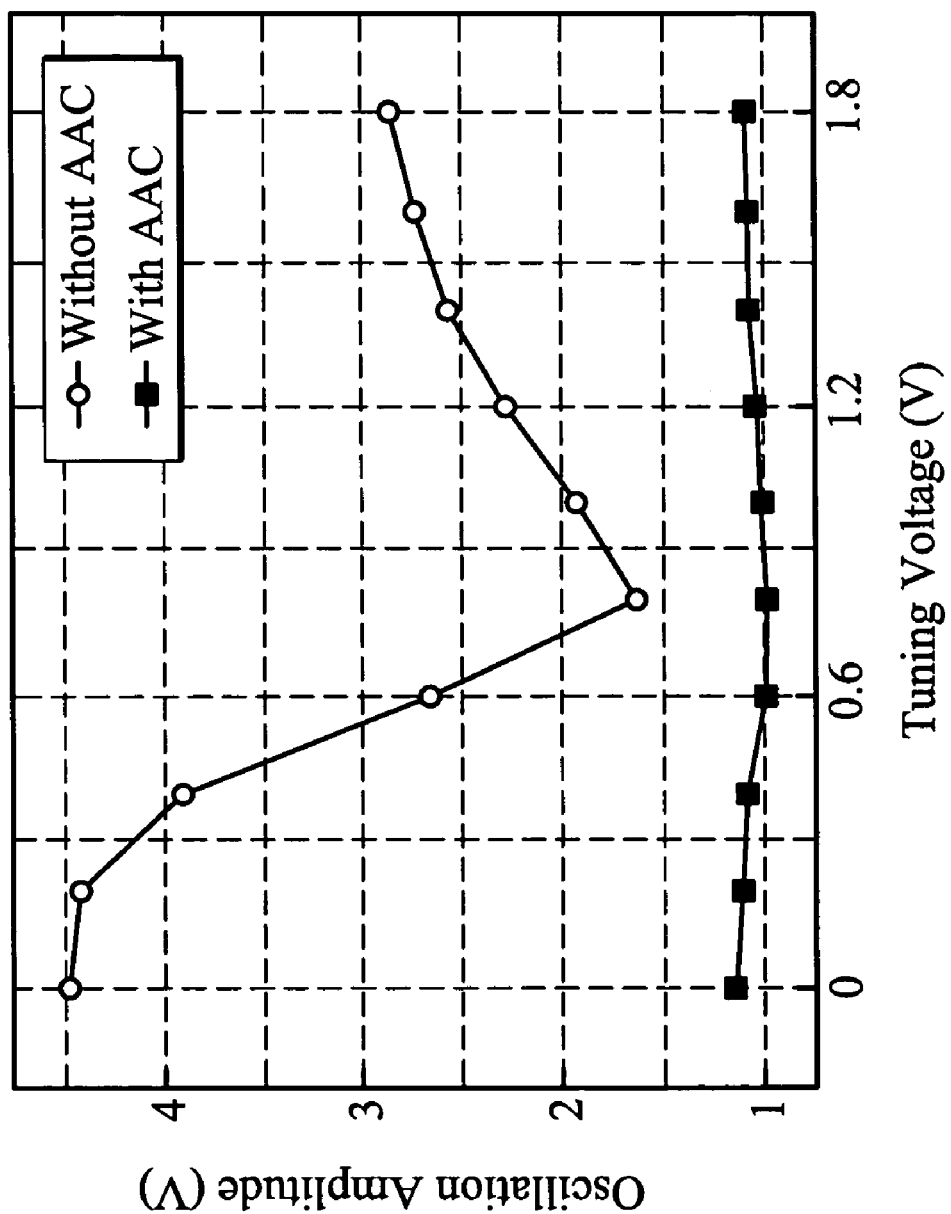
FIG. 7 shows the relationship of oscillation amplitude against the tuning voltage with and without the amplitude control circuit according to an embodiment of the invention.

The oscillation amplitude as a function of tuning voltage was also studied with the results shown in FIG. 7. It can be seen that without the amplitude control according to some embodiments of the invention, the amplitude variation exceeds 2.8V over the entire tuning range, and the maximum amplitude reaches about 4V, exceeding twice the power supply voltage. While with the automatic amplitude control, the amplitude variation is about 0.15V over the whole tuning range, and the amplitude is stabilized to about 0.6V.

Accordingly, the embodiments of the invention provide a VCO circuit with broad tuning range. Tuning the resistance of the tunable resistor connected to a capacitor in serial, results in tuning range of over 50% for the CMOS VCO according to embodiments of the invention. Moreover, a stable amplitude control loop is also incorporated in the circuit, ensuring stable oscillation amplitude over the entire tuning range.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A voltage-controlled oscillator circuit, comprising:
    a pair of inductors coupled to a first power source;
    a variable resistor;
    a pair of capacitors respectively coupled between the variable resistor and the pair of inductors in serial;
    a pair of first switches respectively coupled between the pair of capacitors and a second power source, wherein the first switch of the pair comprises a first gate coupled to a connection point of the other first switch and the corresponding capacitor; and
    an amplitude control circuit having
    a peak detector having a first input terminal coupled to a connection point of the capacitor and the corresponding inductor, and a first output terminal, wherein a voltage level of the first output terminal tracks that of the first input terminal; and
    a second switch coupled between the first control gates of the first switches, having a second gate coupled to a second output terminal.

2. The voltage-controlled oscillator circuit as claimed in claim 1, wherein the amplitude control circuit, further comprises:
    an operational transconductance amplifier having a second first input terminal coupled to the first output terminal, a second second input terminal for receiving a reference voltage, and the second output terminal for outputting an output signal according to the voltage level of the first output terminal and the reference voltage; and wherein a turn-on status of the second switch corresponds to the output signal output by the operational transconductance amplifier.

3. The voltage-controlled oscillator circuit as claimed in claim 2, wherein a first current is injected into the first output terminal to increase a voltage level of the first output terminal when a voltage level of the first input terminal exceeds that of the first output terminal, and wherein a second current is drained from the first output terminal to decrease the voltage level of the first output terminal when the voltage level of the first input terminal is lower than that of the first output terminal.

4. The voltage-controlled oscillator circuit as claimed in claim 2, wherein a voltage level of the second output terminal is stable when a voltage level of the second first input terminal is equal to the reference voltage.

5. The voltage-controlled oscillator circuit as claimed in claim 2, wherein the second output terminal outputs a control current as the control signal to the second control gate of the second switch when a voltage level of the second first input terminal exceeds the reference voltage.

6. The voltage-controlled oscillator circuit as claimed in claim 2, wherein the operational transconductance amplifier further comprises a third switch coupled between the second output terminal and ground.

7. The voltage-controlled oscillator circuit as claimed in claim 6, wherein the third switch is a MOS transistor having a gate coupled to the second output terminal, and a drain and a source both connected to ground.

8. The voltage-controlled oscillator circuit as claimed in claim 1, wherein the first power source is a current source.

9. The voltage-controlled oscillator circuit as claimed in claim 8, wherein the current source is generated by a current mirror.

10. The voltage-controlled oscillator circuit as claimed in claim 1, wherein the second power source is ground.

11. The voltage-controlled oscillator circuit as claimed in claim 1, wherein the variable resistor comprises a transistor having a third control gate.

12. The voltage-controlled oscillator circuit as claimed in claim 11, wherein a resistance of the variable resistor is determined according to a voltage supplied to the third control gate.

13. The voltage-controlled oscillator circuit as claimed in claim 1, wherein the first switch is an NMOS transistor comprising the first control gate, a source, and a drain.

14. The voltage-controlled oscillator circuit as claimed in claim 13, wherein the first control gate of the first switch is direct current coupled to the drain of the other first switch.

15. The voltage-controlled oscillator circuit as claimed in claim 1, wherein the first control gate of the first switch is direct current coupled to the connection point of the other first switch and the corresponding capacitor.

16. The voltage-controlled oscillator circuit as claimed in claim 8, wherein the inductors are respectively coupled between the current source and the second power source.

* * * * *